(12) United States Patent
Jeon et al.

(10) Patent No.: US 11,658,648 B1
(45) Date of Patent: May 23, 2023

(54) VARIATION TOLERANT LINEAR PHASE-INTERPOLATOR

(71) Applicant: Avago Technologies International Sales Pte. Limited, Singapore (SG)

(72) Inventors: Hyung-Joon Jeon, Irvine, CA (US); Yonghyun Shim, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/589,682

(22) Filed: Jan. 31, 2022

(51) Int. Cl.
*H03K 5/135* (2006.01)
*H03L 7/085* (2006.01)
*H03L 7/08* (2006.01)
*H03K 5/00* (2006.01)

(52) U.S. Cl.
CPC ............. *H03K 5/135* (2013.01); *H03L 7/085* (2013.01); *H03K 2005/00052* (2013.01); *H03L 7/0807* (2013.01)

(58) Field of Classification Search
None
See application file for complete search history.

(56) References Cited

U.S. PATENT DOCUMENTS

| | | | | |
|---|---|---|---|---|
| 7,672,406 B2* | 3/2010 | Takeuchi | .............. | H03L 7/0814 375/345 |
| 10,892,763 B1* | 1/2021 | Hidaka | ................... | H03L 7/087 |

* cited by examiner

*Primary Examiner* — Cassandra F Cox
(74) *Attorney, Agent, or Firm* — Quarles & Brady LLP (57) ABSTRACT

A system includes a sampler, a receiver phase-locked loop circuit configured to provide one or more input clock signals, and a phase interpolation circuit coupled to the receiver phase-locked loop circuit and the sampler. The phase interpolation circuit further includes a first phase interpolator configured to generate a first recovered clock signal based on the one or more input clock signals and a first code, and a second phase interpolator configured to generate a second recovered clock signal based on the one or more input clock signals and a second code, wherein the second code has an interpolation code offset from the first code, wherein the interpolation code offset corresponds to a phase shift in the second recovered clock signal relative to the first recovered clock signal, wherein the outputs of the first phase interpolator and second phase interpolator are configured to be merged.

20 Claims, 5 Drawing Sheets

VARIATION TOLERANT LINEAR PHASE-INTERPOLATOR

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for addressing errors introduced by non-linearity in phase interpolators.

BACKGROUND

A phase interpolator (PI), also commonly referred to as a "phase rotator," is a core component that enables essential transceiver functions, such as clock and data recovery (CDR), loop timing mode, and spread spectrum clocking (SSC). Transceiver performance suffers from integral non-linearity (INL) in the PI, which introduces jitter to the recovered clock.

Jitter is important in systems with advanced modulation such as pulse amplitude modulation 4-level (PAM4) and quadrature amplitude modulation 16-level (QAM16)/quadrature amplitude modulation 64-level (QAM64), which are the dominant modulation scheme for links with speed 100 G and above. The timing and noise margin of a modulated signal are significantly smaller than for a non-return-to-zero (NRZ) signal. For analog-to-digital converter (ADC) based receivers with advanced modulation, inaccurate sampling clock timing degrades ADC performance. The degradation effects become greater with high speed input signals.

Thus, methods, systems, and apparatuses for a variation tolerant linear phase-interpolator are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Various embodiments provide tools and techniques for a variation tolerant linear phase interpolator.

In some embodiments, a method for variation tolerant linear phase interpolation is provided. The method may include obtaining one or more input clock signals, and generating, via a first phase interpolator, a first recovered clock signal based on the one or more input clock signals and a first code. The method may continue by generating, via a second phase interpolator, a second recovered clock signal based on the one or more input clock signals and a second code. The second code may have an interpolation code offset from the first code, wherein the interpolation code offset corresponds to a phase shift in the second recovered clock signal relative to the first recovered clock signal. The method may further include merging the first recovered clock signal and second recovered clock signal, wherein when combined, the first and second recovered clock signals form a combined recovered clock signal.

In some embodiments, an apparatus for a variation tolerant linear phase interpolator is provided. The apparatus may include a first phase interpolator configured to obtain one or more input clock signals, and generate a first recovered clock signal based on the one or more input clock signals and a first code. The apparatus may further include a second phase interpolator configured to obtain the one or more input clock signals, generate a second recovered clock signal based on the one or more input clock signals and a second code. The second code may have an interpolation code offset from the first code, wherein the interpolation code offset corresponds to a phase shift in the second recovered clock signal relative to the first recovered clock signal. The outputs of the first phase interpolator and second phase interpolator may be configured to be merged.

In in further embodiments, a system for a variation tolerant linear phase interpolator is provided. The system may include a sampler configured to convert an input signal to a digital output signal, a receiver phase-locked loop circuit configured to provide one or more input clock signals, and a phase interpolation circuit coupled to the receiver phase-locked loop circuit and the sampler, wherein the phase interpolation circuit is configured to provide a combined recovered clock signal to the sampler. The phase interpolation circuit may further include a first phase interpolator configured to generate a first recovered clock signal based on the one or more input clock signals and a first code, and a second phase interpolator configured generate a second recovered clock signal based on the one or more input clock signals and a second code. The second code may have an interpolation code offset from the first code, wherein the interpolation code offset corresponds to a phase shift in the second recovered clock signal relative to the first recovered clock signal. The outputs of the first phase interpolator and second phase interpolator are configured to be merged, wherein when combined, the first and second recovered clock signals form a combined recovered clock signal.

In the following description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Conventional approaches to mitigating INL attempt to adjust transistor size and input amplitude combinations to linearize a phase-to-input control relationship. However, conventional approaches are unable to achieve good linearity over different process corners, voltage, and temperature (PVT) conditions. These approaches often lead to excessive power consumption and/or area overhead, resulting in a large transistor size or large input amplitude. Another conventional approach attempts to shape a PI current biasing digital-to-analog converter (DAC) with a non-uniform weighting to equalize the non-linear phase-to-PI code relationship. Similarly, this process cannot be applied over different PVT conditions, as PI non-linearity shape (e.g., the shape of a PI non-linearity profile, which plots INL over PI code) varies with PVT. The PI non-linearity shape can also change with input signal amplitude variations, and rise/fall time, which cannot be compensated by non-uniform weighting of the PI current biasing DAC. Moreover, shaping of the PI current biasing DAC (e.g., current DAC) can result in large amplitude variation over PI code (e.g., the amplitude of the PI output varies depending on PI code).

The embodiments set forth below may allow for a more robust, scalable approach to mitigating INL. Specifically, the embodiments below describe a PI architecture for cancelling INL. Utilizing an 8-bit code phase interpolator, the proposed architecture may, in some embodiments, effectively realize suppression of INL from more than 6 least significant bit (LSB) to about 1 LSB, and a worst case peak-to-peak INL ($INL_{pp}$) of less than ⅓ of $INL_{PP}$ before INL cancellation. Furthermore, worst case jitter during PI rotation may be reduced by more than 1 picosecond (ps) in a 28 GHz clock. Further, the proposed techniques may tolerate a wide range of operating conditions, including PVT variations and a large range of frequency variation.

As a result, excellent PI linearity and robust performance over PVT variations and mismatch may be realized, without additional power/area overhead as caused by the transistor size and input amplitude adjustment approach, and with no loading overhead to downstream circuit stages (e.g., CML to CMOS conversion circuits, or buffers) as caused by the large output amplitude variations of the current biasing DAC approach. Moreover, the INL cancellation approach may be scalable to higher frequencies. The improvements to PI linearity can also lead to improvements on receive (Rx) jitter tolerance, effective number of bits (ENOB), and transmit (Tx) output jitter. Additionally, INL cancellation may be implemented without the need for background calibration. These improvements may have the effect of enhancing data rate/speed, and extending channel reach by reducing clock jitter.

Figure 1:
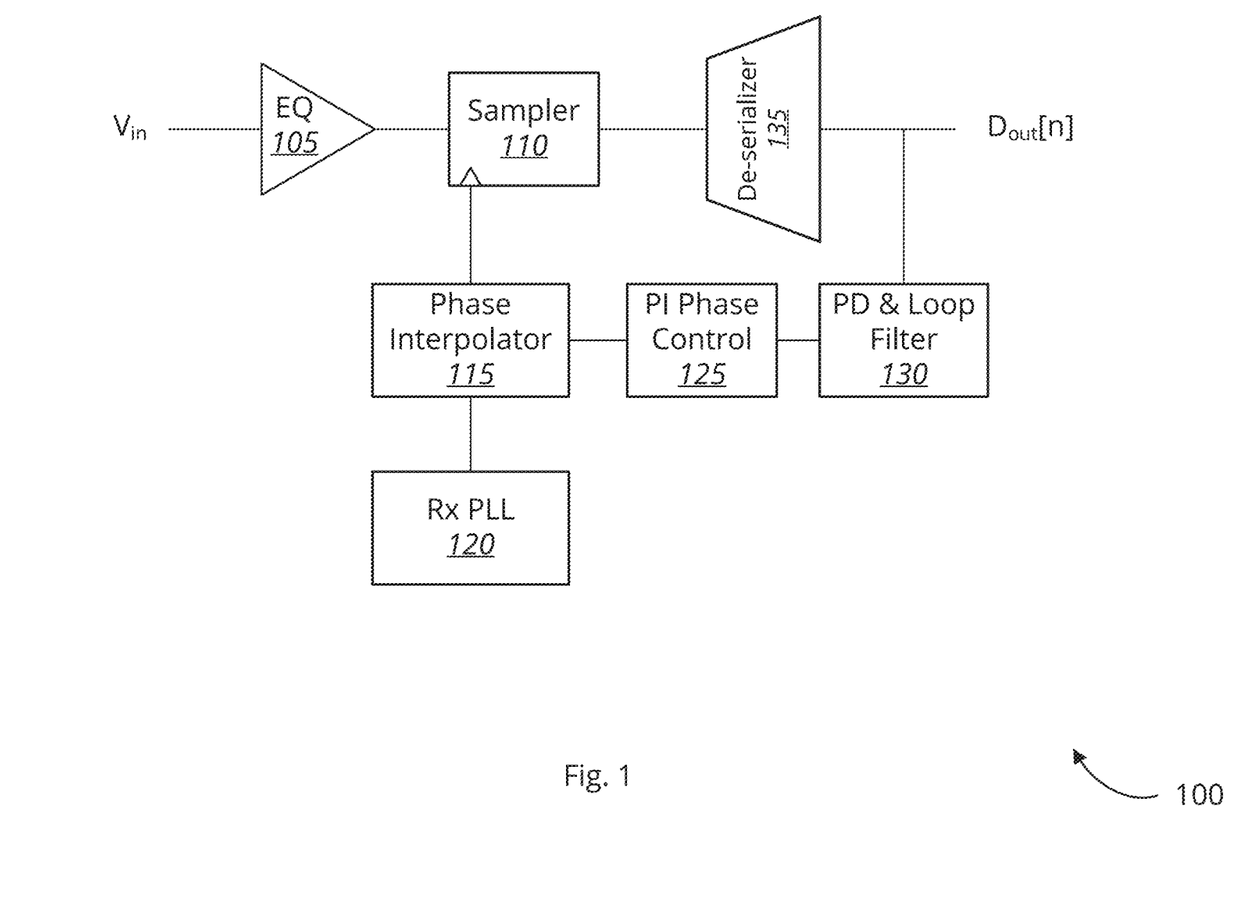
FIG. 1 is a schematic block diagram of a receiver system, in accordance with various embodiments.

FIG. 1 is a schematic block diagram of receiver system 100, in accordance with various embodiments. The system 100 includes an equalizer 105, sampler 110, phase interpolator 115, receiver (Rx) phase-locked loop (PLL) 120, PI phase control 125, phase detector and loop filter 130, and de-serializer 135. It should be noted that the various components of the system 100 are schematically illustrated in FIG. 1, and that modifications to the various components and other arrangements of system 100 may be possible and in accordance with the various embodiments.

In various embodiments, the system 100 may be configured to receive an input signal, $V_{in}$, to be converted to a digital output signal $D_{out}[n]$. In various examples, $V_{in}$ may be an analog signal received by the receiver system 100. In some examples, equalizer 105 may be configured to equalize the input signal, $V_{in}$. In some examples, equalizer 105 may include a linear equalizer, such as a continuous time linear equalizer (CTLE) while in further embodiments, equalizer 105 may include a non-linear equalizer, such as a decision feedback equalization (DFE), or a combination of CTLE and/or DFE. In some examples, equalizer 105 may include one or more equalizers in a multistage arrangement. Equalizer 105 may include, without limitation, a digital equalizer and/or a hybrid equalizer. Equalizer 105 may further include an adjustable amplifier with automatic gain control (AGC). According to some examples, equalizer 105 may be configured to equalize the input signal, $V_{in}$, to account for channel characteristics (e.g., channel loss) and noise.

The equalized signal, from equalizer 105, may be provided to sampler 110. In some examples, sampler 110 may include an ADC and/or one or more slicers. According to various embodiments, sampler 110 may be configured to sample the equalized input signal, $V_{in}$. In some examples, the input signal may be a demodulated signal, of which sampler 110 sequentially outputs sample signals to the de-serializer 135. In various embodiments, sampler 110 may be clocked by a clock signal generated by the PI 115. Sampler 110 may sample serial data of the input signal, equalized by equalizer 105, and synchronized with the clock signals output by PI 115. Thus, de-serializer 135 may convert the serial samples of the sampler 110 into multiple parallel samples to be passed to downstream digital blocks as the respective bits of the output digital signal $D_{out}[n]$. In one example, the de-serializer 135 may include a de-multiplexer circuit.

In some examples, to generate the clock signals, PI 115 may receive, from Rx PLL 120, a set of quadrature clock signals (e.g., in-phase clock signals (I/IB) and quadrature clock signals (Q/QB)). In various examples, each of the clock signals may be phase-shifted from a reference clock signal, where the four clock signals I, IB, Q, and QB are evenly spaced. In some examples, I and Q may be separated in phase by 90 degrees, IB phase shifted 90 degrees from Q, and QB phase shifted 90 degrees from IB. Although the clock signals are described herein as being four-phase quadrature clock signals with respect to various examples for explanatory purposes, it is to be understood that the clock signals are not limited to four-phase quadrature clock signals, and that in other embodiments, a different number of clock signals may be used. Thus, the clock signals may, in various examples, include multi-phase clock signals (e.g., four-phase, eight-phase) with an m-number of phases, where m is an integer. In some examples, the multi-phase clock signals may be provided by the PLL, such as Rx PLL 120. A PLL, such as Rx PLL 120 (and Tx PLL 220 below) may be a circuit configured to generate clock signals based on a reference input signal, with feedback mechanisms to accurately track the frequency of the reference signal. In other examples, the PI 115 may be configured to generate the multi-phase clock signals from a reference clock signal directly, as opposed to receiving the multi-phase clock signals from a PLL.

In some examples, PI 115 may generate complementary recovered clock signals CK and CKb, which may be a sample clock signal for sampler 110. In various examples, PI 115 may adjust or interpolate the phases of the clock signals from the Rx PLL 120, based on a phase control signal generated by PI phase control 125. Thus, the recovered clock signals may be clock signals generated by the PI 115, based on phase errors extracted from the output digital signal. Accordingly, in some examples, PI phase control 125 may further be coupled to a phase detector (PD) and loop filter 130 circuit. The PD and loop filter 130 may be configured to filter phase error information extracted from the output digital signal $D_{out}[n]$ and track the phase of input signal. Thus, PI phase control 125 may receive phase error information extracted from the output digital signal from PD and loop filter 130.

Thus, while PI phase control 125 may mitigate some timing error through, for example, a clock-data-recovery (CDR) loop, it may not address the non-linearity of PI 115. Accordingly, a PI 115 implementing an INL cancellation architecture is set forth and described in further detail below with respect to FIG. 3.

Figure 2:
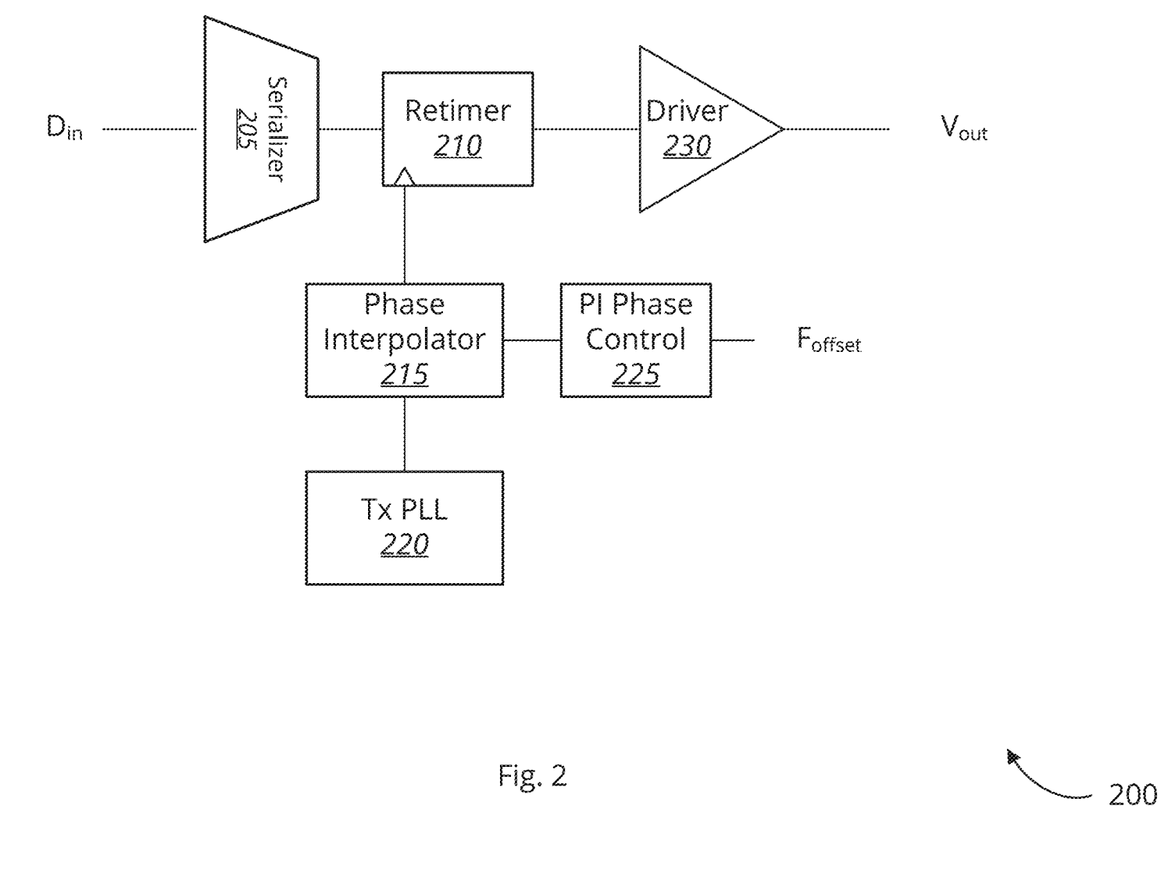
FIG. 2 is a schematic block diagram of a transmitter system, in accordance with various embodiments.

FIG. 2 is a schematic block diagram of a transmitter system 200, in accordance with various embodiments. The system 200 includes a serializer 205, retimer 210, PI 215, Tx PLL 220, PI phase control 225, and driver 230. It should be noted that the various components of the system 200 are schematically illustrated in FIG. 2, and that modifications to the various components and other arrangements of system 200 may be possible and in accordance with the various embodiments.

In various embodiments, the system 200 may be configured to receive a digital input signal, $D_{in}[n]$, to be converted to an analog output signal $V_{out}$. The serializer 205 may be configured to convert the multiple parallel bits of the digital input signal, $D_{in}[n]$, into a serial stream respective bits. In one example, serializer 135 may include a multiplexer circuit. The retimer 210 may be configured to recover the data from the serializer 205, extract the embedded clock from the digital input signal, and re-transmit the data with a clock signal provided by PI 215. Thus, the retimer 210 may be configured to synchronize the outputs from the serializer to the correct clock phase.

The driver 230 may receive the output of the retimer 210 and convert the data stream into an analog signal, and drives the analog signal into the appropriate channel. In various examples, the driver 230 may be implemented as voltage mode driver circuitry, current mode driver circuitry, or a DAC. In some examples, serializers 205 and retimers 210 may be merged as a single circuit element. Similarly, in some examples, retimers 210 and drivers 230 may also be merged as a single circuit element. The Tx PLL may include circuitry for providing a low noise clock signal for the retimer 210.

In various examples, the transmitter system 200 may transmit the data at a slightly different rate than the clock signal from Tx PLL 220 frequency. Thus, the transmitter system 200 may employ a PI 215 to introduce a frequency offset from the Tx PLL 220. In various examples, PI codes may be generated (or controlled) via the PI phase control circuit 225. Accordingly, the PI phase control circuit 225 may be configured to generate the PI code according to a given frequency offset ($F_{offset}$). The phase of the PI output clock signal may be shifted and/or rotated by the PI phase control circuit 225 to introduce the desired frequency offset to the Tx PLL 220 clock signal.

In the transmitter system 200, PI non-linearity may lead to jitter, which may degrade retimer 210 performance and distort driver 230 output. Accordingly, a PI 215 implementing an INL cancellation architecture is set forth and described in further detail below with respect to FIG. 3.

Figure 3:
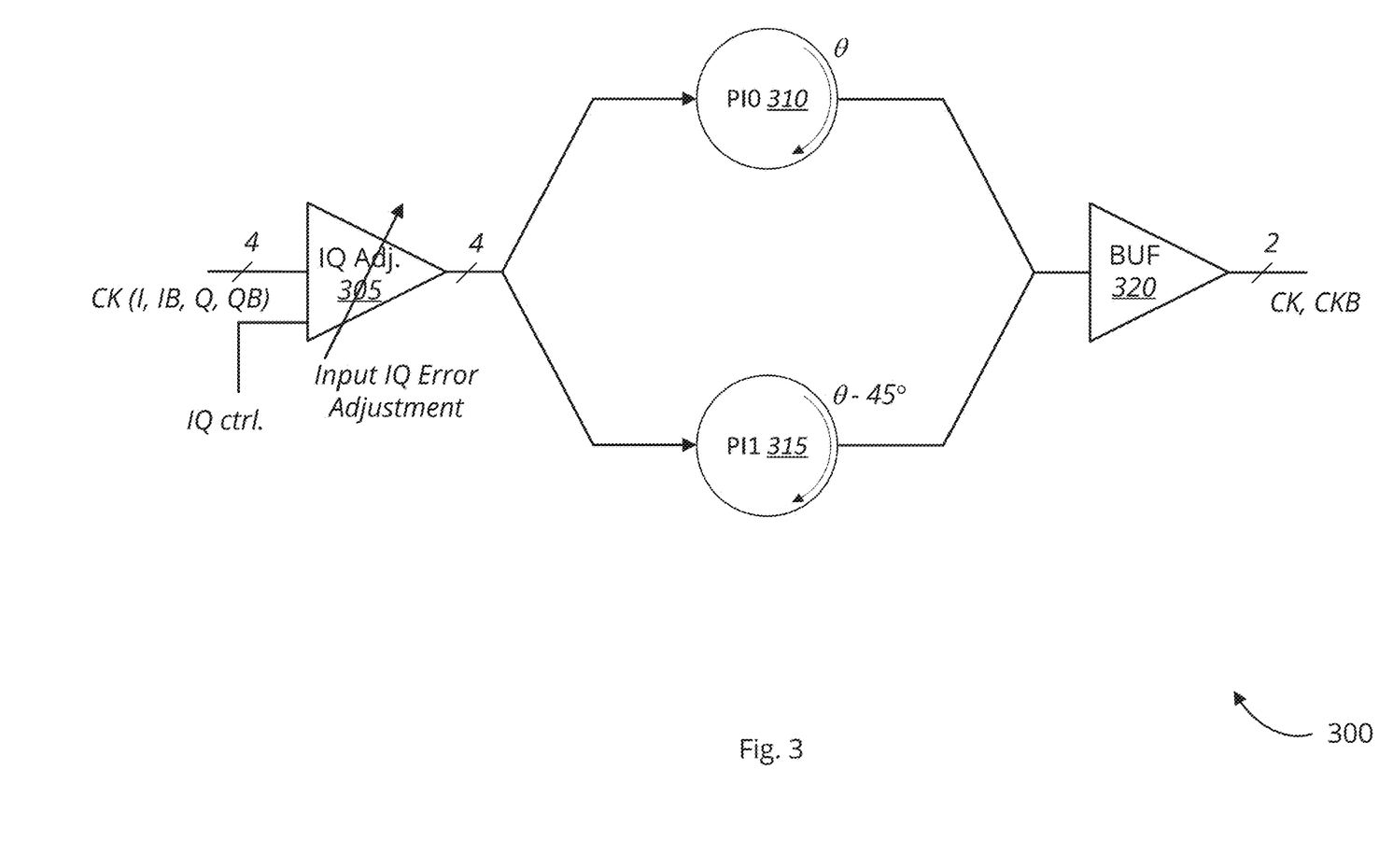
FIG. 3 is a schematic block diagram of a variation tolerant phase interpolator circuit, in accordance with various embodiments.

FIG. 3 is a schematic block diagram of a variation tolerant phase interpolator circuit 300, in accordance with various embodiments. The variation tolerant phase interpolator circuit 300 includes an IQ adjustment circuit 305, first phase interpolator (PI0) 310, and second phase interpolator (PI1) 315, and buffer 320. It should be noted that the various components of the circuit 300 are schematically illustrated in FIG. 3, and that modifications to the various components and other arrangements of circuit 300 may be possible and in accordance with the various embodiments.

According to various embodiments, the IQ adjustment circuit 305 may be configured to receive clock signals, for example, from an Rx PLL (e.g., Rx PLL 120), as previously described. The clock signals may include I, IB, Q, and QB. The IQ adjustment circuit 305 may be configured to adjust the clock signals to mitigate error in the input IQ clock signals, based on an IQ control signal, (IQ ctrl.). IQ ctrl. may, in some examples, be provided via a PI phase control circuit (e.g., PI phase control circuit 125), while in other examples, a separate control block (e.g., a separate control circuit detecting multi-phase error in the input clock, in this example IQ error) may generate IQ ctrl. Thus, in various examples, the IQ adjustment circuit 305 may be an input phase control circuit, configured to adjust the phase of multi-phase input clock signals (in this example, the IQ clock signals, and thus named the IQ adjustment circuit 305) and/or an amplitude of the multi-phase input clock signals. Accordingly, in some examples, the IQ adjustment circuit 305 may include an adjustable amplifier. Thus, the adjusted input clock signals may be provided to each of PI0 310 and PI1 315, respectively.

Accordingly, in various embodiments, the IQ adjustment circuit 305 may be coupled to both PI0 310 and PI1 315. In various embodiments, PI0 310 and PI1 315 may be referred to as the PI cores of the variation tolerant phase interpolator circuit 300. Thus, in various examples, the variation tolerant phase interpolator circuit 300 may utilize a dual PI core architecture for INL cancellation. In other examples, the variation tolerant phase interpolator circuit 300 may include more than two PI cores. For example, a multi-path, multiple-PI core architecture may be utilized, where the multiple PI cores have a given phase offset. The phase offset may be determined, for example, based at least in part, on an INL profile of the PI cores. In some examples, a phase offset, at which INL is minimized when the outputs of the multiple PI cores are combined, may be determined and set as the phase offset between the multiple PI cores. In yet further examples, multiple phase offsets may be utilized between the multiple PI cores, where a respective phase offset between PI cores may vary.

Accordingly, in one set of examples, the phase interpolators PI0 310 and PI1 315 may be phase interpolators configured to have a 45-degree code offset, corresponding to four-phase quadrature clock inputs. For example, PI0 310 may have a code offset $\theta$, and PI1 315 may have a code offset $\theta-45°$. Given the code offset of the PI cores, the respective INL of PI0 310 and PI1 315 may be averaged and cancelled by merging (e.g., adding and/or averaging) the outputs of PI0 310 and PI1 315.

For example, in various embodiments, PI0 310 and PI1 315 may be configured to generate a respective recovered clock signal based on a code (e.g., a PI code), in which the respective phase of the recovered clock signals may be shifted according to the code. Accordingly, in various embodiments, PI0 310 and PI1 315 may first be configured to obtain (or in some examples generate) a PI code based on feedback from a phase control circuit, such as PI phase control circuit 125 of FIG. 1. Non-linearity in the PI, however, may mean the code to output signal phase is non-linear. With quadrature clock signals, an INL profile of a PI may repeat every quarter (90°) of full PI code. Thus, by averaging the outputs of PI0 310 and PI1 315, which are offset by a 45° code-offset, the INL may be averaged and/or canceled, and the effects of INL on the recovered clock signal may be reduced (e.g., timing error, jitter, etc.).

In some examples, merging of the outputs may be implemented directly at the outputs of PI0 310 and PI1 315. In other examples, merging may be performed after the output of PI0 310 and PI1 315 have been passed through one or more buffer stages. Merging may include, without limitation, summing and/or averaging of the outputs of the PI cores (e.g., PI0 310 and PI 1 315), to produce a combined recovered clock signal (e.g., an INL-canceled recovered clock signal). The effect of INL cancellation is described in greater detail below, with respect to FIG. 4. In yet further embodiments, the phase offset between the two PI cores may be set according to the number of input phases of an input clock signal. For example, for an 8-phase clock input, a phase offset of 22.5° between PI0 310 and PI1 315 may be utilized, where the INL profile of a PI may repeat every eighth (45°) of a full PI code.

As the INL profiles of phase interpolators may vary with PVT conditions, in some examples, PI0 310 and PI1 315 may be (and may have been) subjected to similar process corners, and further, may be implemented in the variation tolerant phase interpolator circuit 300 to be subject to similar voltage and temperature conditions.

In some further examples, the output of each PI may be regulated to minimize amplitude-to-phase error conversion. Specifically, the outputs of PIs at different code offsets may show different amplitude trends. For example, the amplitude of the output of a PI at code offset $\theta$ may be different from the output at code offset $\theta-45°$. Amplitude mismatch may, in some examples, manifest as additional phase non-linearity due to amplitude-to-phase conversion error. Accordingly, the output amplitude of PI0 310 and PI1 315 may be regulated to avoid amplitude mismatch. In some examples, the DAC units of the PI, such as PI0 310 and PI1 315, may be segmented into groups with different code offsets. In one set of examples, each segment of DAC units may include three DAC units, each having a respective code offset (for example, code−45°, code, and code+45°). Each segment of DAC units may, in various examples, be controlled by a respective PI code. The output of each respective DAC unit may, in some examples, be weighted. For example, the DAC units with code offsets of code−45° and code+450 may be weighted 0.25×, while the DAC unit with no code offset (e.g., code) may be weighted 0.5×. Thus, amplitude mismatch at the different code offsets may be averaged. In this way, in some examples, a phase constellation with good amplitude matching (e.g., an octagonal constellation) may be created. In some further embodiments, amplitude clipping buffers may be employed at the outputs of each of the respective PI cores, PI0 310 and PI1 315, to ensure amplitudes are matched. For example, a clipping buffer may be a buffer configured to clip the output amplitude of the respective PI at a threshold voltage (e.g., clip the PI outputs at a maximum positive voltage and/or a maximum negative voltage).

In various embodiments, input IQ error may also be adjusted, for example, by IQ adjustment circuit 305. IQ error at the PI input may cause unmatched INL profiles between the two PIs, PI0 310 and PI1 315. This may introduce residual non-linearity after INL cancellation between the two PIs. Thus, in some examples, input IQ error may be adjusted to improve INL cancellation performance, and avoid residual INL. In various embodiments, IQ adjustment circuit 305 may adjust the input IQ signals (e.g., input clock signals from the Rx PLL), for example, by adjusting a phase and/or amplitude of the input IQ signals. In some examples, IQ adjustment circuit 305 may include buffers with tunable capacitors and/or a resistor network to make the appropriate adjustments. In some further examples, the adjustments may be controlled based on an IQ control signal. Although described as input IQ error with respect to IQ clocks, it is to be understood that in other embodiments where multi-phase clock signals are used, the IQ error may instead be a multi-phase error. As used herein, multi-phase error (including IQ error) may include phase error in the input clock signals, such as errors in the relative phases between the clock signals (phase imbalance), and other IQ imbalance (e.g., gain imbalance). Thus, an IQ adjustment circuit 305 may also be referred to as an input phase control circuit, configured to adjust respective phases of the multi-phase input clock signals.

Figure 4:
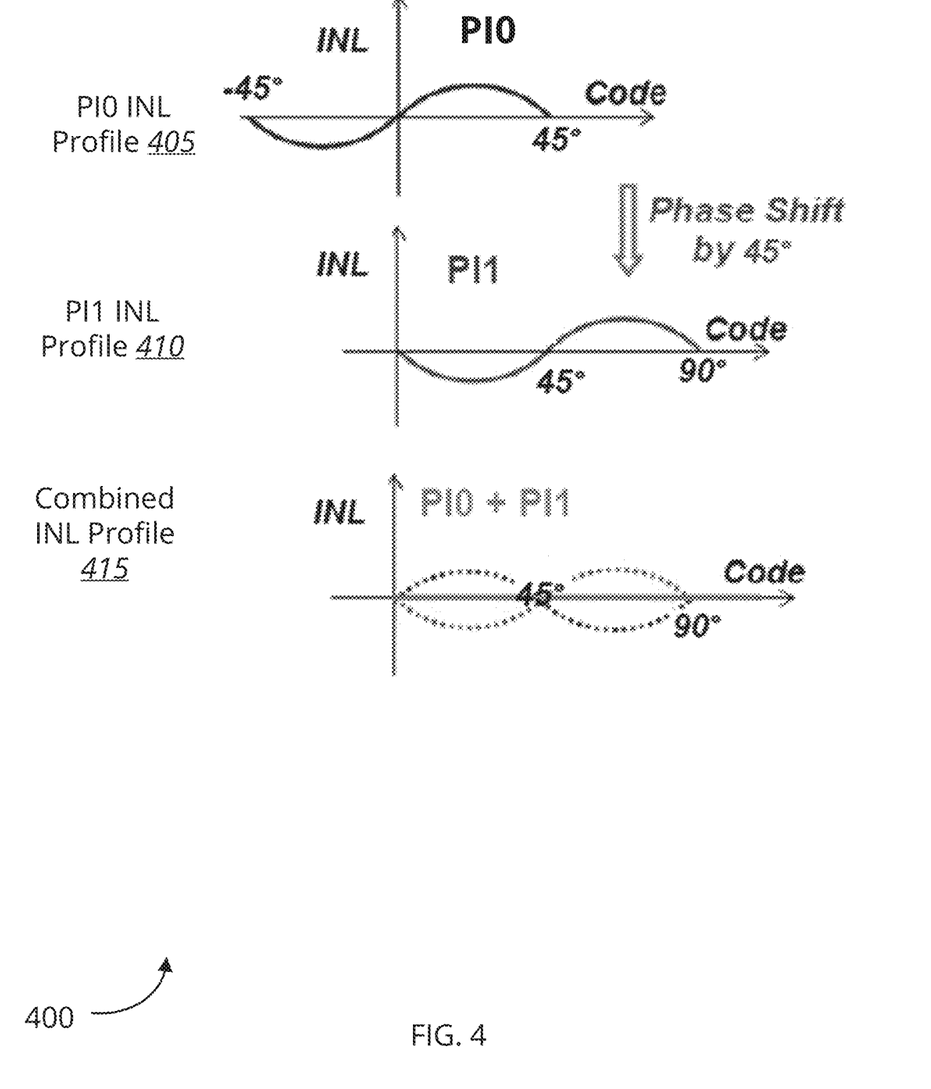
FIG. 4 is a schematic diagram illustrating a process of INL cancellation, in accordance with various embodiments.

FIG. 4 is a schematic diagram illustrating a process 400 of INL cancellation, in accordance with various embodiments. Specifically, FIG. 4 illustrates the INL profile of a phase interpolator, which may vary over code. With quadrature input clocks, an INL profile of a PI may repeat every quarter (90°) of full PI code. As shown, for example, PI0 310 may have a first INL profile 405. PI1 315 may, in contrast, have a second INL profile 410, which is phase shifted by 45°. Accordingly, identical (or near-identical) PIs with a 45° offset may have out-phased INL profiles, in which the INL may be canceled by averaging (or in some examples, adding or combining) of the two out-phased INL profiles. The averaging of the INL profiles is shown in the combined INL profile 415.

In various examples, the shapes of the INL profiles may vary based on the particular PI implementation and architecture. For example, an INL profile may include, without limitation, a sinusoidal (as shown) shape, sawtooth shape, square wave shape, etc. However, INL profiles of PIs may be cyclical in nature, and repeat a given number of times over a full PI code (e.g., 360°), depending on the number of phases of the multi-phase input clock signals. For example, as previously described, with an 8-phase input clock signal, the INL profile of a PI may repeat roughly every 45°. Thus, when two PIs are offset by half of the period of the INL profile (e.g., 22.5°), the INL profiles may be out-phased. As used herein, out-phased may mean cancellation (partial or complete) of the waveforms (e.g., INL) by being offset in phase. In some examples, out-phased may include cancellation of the waveform (e.g., INL) such that INL is minimized (or substantially minimized to the extent measurable) in the case of non-ideal waveforms.

Figure 5:
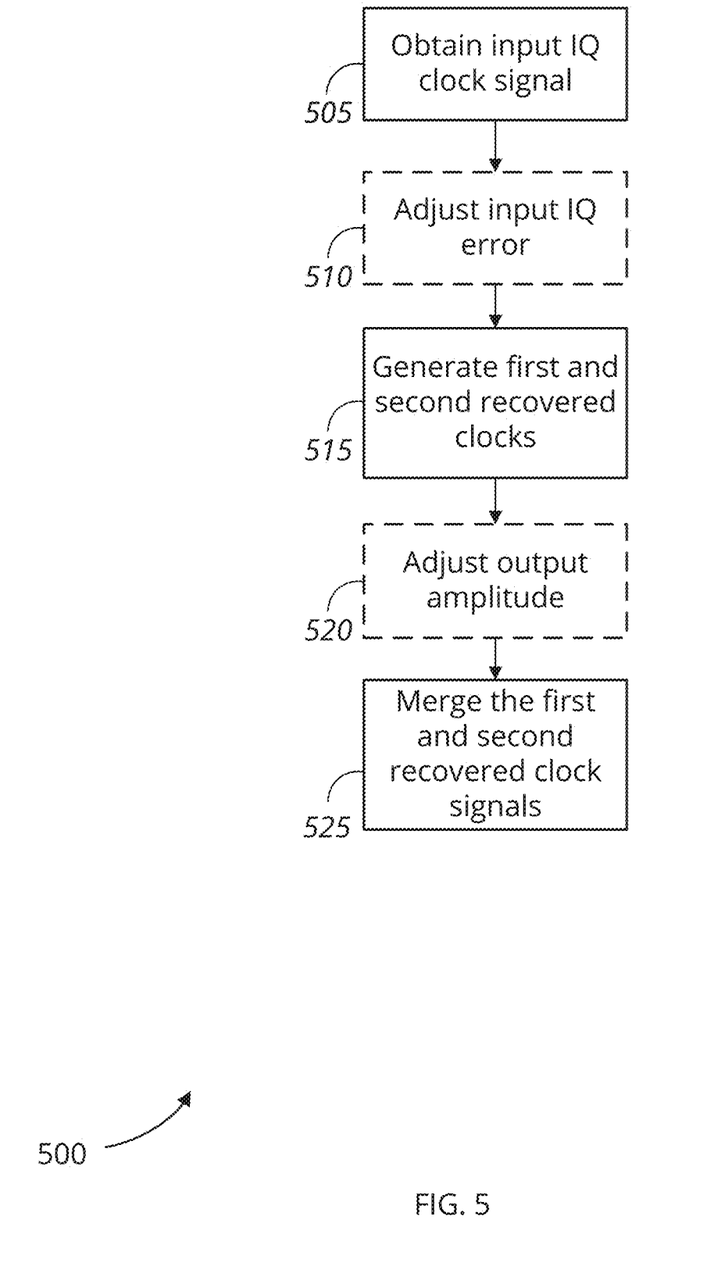
FIG. 5 is a flow diagram of a method for variation tolerant linear phase interpolation, in accordance with various embodiments.

FIG. 5 is a flow diagram of a method 500 for variation tolerant linear phase interpolation, in accordance with various embodiments. The method 500 may begin, at block 505, by obtaining an input IQ clock signal. In various examples, the input IQ clock signals may include four-phase, quadrature input clock signals (e.g., I, Q, IB, and QB), which are separated in phase by 90°. In further embodiments, the input clock signals may include additional phases, for example, an 8-phase clock input. As previously described, the input IQ clock signals may be obtained by a phase interpolator from an Rx PLL circuit.

The method 500 may continue, at block 510, by adjusting the input IQ clock signals for input IQ error. As previously described, input IQ error may be adjusted, for example, by an IQ adjustment circuit. In various embodiments, the IQ adjustment circuit may adjust input IQ clock signals by adjusting a phase and/or amplitude of the input IQ clock signals. In some examples, IQ adjustment circuit may include buffers with tunable capacitors (e.g., adjustable amplifier), and/or a resistor network to make the appropriate adjustments. In some further examples, the adjustments may be controlled based on an IQ control signal. In yet further embodiments, the input IQ clock signals may be adjusted, based on an IQ control signal (IQ ctrl.). As previously described, in some examples, IQ ctrl. may be provided via a PI phase control circuit.

At block 515, the method 500 may continue by generating respective first and second recovered clock signals based on the input IQ clock signals. In various embodiments, input IQ clock signals may be provided to first and second phase interpolators (PI0 and PI1). The input IQ clock signals may be adjusted for input IQ error, as previously described. In some examples, the first and second phase interpolators may be configured to have a 45-degree code offset relative to each other, corresponding to four-phase quadrature clock inputs. In other examples, the first and second phase interpolators may be configured to have a code offset (relative to each other) based on the number of input phases of an input clock signal. For example, the first and second phase interpolators may be configured to have a 22.5-degree code offset for an 8-phase clock input.

In various embodiments, each phase interpolator PI0 and PI1 may be configured to generate a respective recovered clock signal (e.g., a first recovered clock signal and second recovered clock signal, respectively). The respective phases of the first and second clock signals may be shifted according to a respective PI code. Thus, in various examples, the first phase interpolator PI0 may generate a first recovered clock signal, having a first phase based on a first code. The second phase interpolator PI1 may generate a second recovered clock signal, having a second phase based on a second code. Accordingly, the second code may be offset from the first code by 45-degrees (e.g., a code producing a 45-degree offset (e.g., 45-degree phase shift) in the second recovered clock signal relative to the first recovered clock signal).

At block 520, the method continues by adjusting an output amplitude of the first and second phase interpolators. As previously described, the output of each PI may be regulated to minimize amplitude-to-phase error conversion. For example, the amplitude of the output of a PI at a code offset θ may be different from the output at code offset θ−45°. Accordingly, in some examples, the output amplitude of PI0 and PI1 may be adjusted to avoid amplitude mismatch. In some examples, each PI core (PI0, PI1) may include a plurality of DAC units. The DAC units (e.g., current-controlling DACs) may be segmented into groups of DAC units with different code offsets. In one set of examples, each segment of DAC units may include three DAC units, each having a respective code offset (for example, code−45°, code, and code+45°) control signals for controlling a respective current source. Each segment of DAC units may, in various examples, be controlled by a respective PI code. Thus, by combining the outputs of the respective DAC units of a segment, an interpolated signal may be generated with the amplitude mismatch at the different code offsets being averaged. In this way, in some examples, a phase constellation with good amplitude matching (e.g., an octagonal constellation) may be created. In some further embodiments, amplitude clipping buffers may be employed at the outputs of each of the respective PI cores to create matched output amplitudes.

At block 525, the method 500 further includes merging the first and second recovered clock signals to produce a combined recovered clock. As previously described, in various examples, the outputs of the first and second phase interpolators may be merged to average and cancel respective INL of the PI cores (e.g., PI0 and PI1). In some examples, the first and second recovered clock signals may be amplitude adjusted outputs of the respective PI cores (PI0 and PI1), as previously described. In some examples, the outputs may be merged directly at the outputs of PI0 and PI1. In other examples, merging may be performed after the outputs of PI0 and PI1 have been passed through one or more respective buffer stages. Merging may include, without limitation, summing and/or averaging of the outputs of the PI cores. Accordingly, by merging the outputs of the code-offset phase interpolators, INL may be averaged and/or cancelled, and the timing error and jitter may be reduced.

The techniques and processes described above with respect to various embodiments may be performed by one or more systems 100, 200 and/or subsystems and components thereof, such as the variation tolerant linear phase interpolator circuit 300 as described above with respect to FIGS. 1-3, and which may perform the methods provided by various other embodiments, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A method comprising:
   obtaining one or more input clock signals;
   generating, via a first phase interpolator, a first recovered clock signal based on the one or more input clock signals and a first code;
   generating, via a second phase interpolator, a second recovered clock signal based on the one or more input clock signals and a second code, wherein the second code has an interpolation code offset from the first code, wherein the interpolation code offset corresponds to a phase shift in the second recovered clock signal relative to the first recovered clock signal; and
   merging an output of the first phase interpolator and an output of the second phase interpolator, wherein when merged, the first and second recovered clock signals are combined to form a combined recovered clock signal.

2. The method of claim 1, further comprising:
   adjusting the one or more input clock signals, wherein adjusting the one or more input clock signals includes adjusting at least one of a phase or amplitude of at least one of the one or more input clock signals based on a multi-phase error of the at least one of the one or more input clock signals.

3. The method of claim 1, further comprising:
   adjusting a respective output amplitude of at least one of the first phase interpolator and second phase interpolator.

4. The method of claim 3, wherein the at least one of the first phase interpolator and second phase interpolator further comprises a plurality of digital-to-analog converters (DACs), wherein the plurality of DACs are segmented into groups of DAC units, wherein each DAC unit in a respective group of DAC units is controlled by a respective at least one of the first code or the second code, wherein adjusting the respective output amplitude includes:
   generating the at least one of the first recovered clock or second recovered clock based on a combined output of each DAC unit in a respective group of DAC units.

5. The method of claim 3, wherein adjusting the output amplitude includes:
   clipping, via a clipping buffer, a voltage of the respective output of the at least one of the first phase interpolator and second phase interpolator.

6. The method of claim 1, wherein the interpolation code offset corresponding to the phase shift in the second recovered clock signal is a 45-degree code offset corresponding to a 45-degree phase shift in the second recovered clock signal relative to the first recovered clock signal.

7. The method of claim 1, wherein the first phase interpolator has a first non-linearity profile relating integral non-linearity (INL) of the first phase interpolator to a phase interpolator code, and wherein the second phase interpolator has a second non-linearity profile relating INL of the second phase interpolator to the phase interpolator code, wherein when the second non-linearity profile is offset in phase from the first non-linearity profile by the interpolation code offset.

8. The method of claim 7, wherein the method further comprises:
   canceling, via a phase interpolation circuit, the first non-linearity profile of the first phase interpolator with the second non-linearity profile of the second phase interpolator by setting the interpolation code such that the first non-linearity profile and second non-linearity profile are out-phased.

9. A circuit comprising:
   a first phase interpolator configured to obtain one or more input clock signals, and generate a first recovered clock signal based on the one or more input clock signals and a first code; and
   a second phase interpolator configured to obtain the one or more input clock signals, generate a second recovered clock signal based on the one or more input clock signals and a second code, wherein the second code has an interpolation code offset from the first code, wherein the interpolation code offset corresponds to a phase shift in the second recovered clock signal relative to the first recovered clock signal;
   wherein the outputs of the first phase interpolator and second phase interpolator are configured to be merged, wherein when merged, the first and second recovered clock signals are combined to form a combined recovered clock signal.

10. The circuit of claim 9, further comprising an input phase control circuit, the input phase control circuit configured to adjust the one or more input clock signals, wherein adjusting the one or more input clock signals includes adjusting at least one of a phase or amplitude of at least one of the one or more input clock signals based on a multi-phase error of the at least one of the one or more input clock signals.

11. The circuit of claim 9, wherein at least one of the first and second phase interpolators further comprises a plurality of digital-to-analog converters (DACs), wherein the plurality of DACs are segmented into groups of DAC units, wherein each DAC unit in a respective group of DAC units is controlled by a respective at least one of the first code or the second code, the at least one of the first and second phase interpolators are configured to generate the at least one of the first recovered clock or second recovered clock based on a combined output of each DAC unit in a respective group of DAC units.

12. The circuit of claim 9, further comprising one or more clipping buffers configured to clip a voltage of a respective output of at least one of the first phase interpolator and second phase interpolator.

13. The circuit of claim 9, wherein the interpolation code offset corresponding to the phase shift in the second recovered clock signal is a 45-degree code offset corresponding to a 45-degree phase shift in the second recovered clock signal relative to the first recovered clock signal.

14. The circuit of claim 9, wherein the first phase interpolator has a first non-linearity profile relating integral non-linearity (INL) of the first phase interpolator to a phase interpolator code, and wherein the second phase interpolator has a second non-linearity profile relating INL of the second phase interpolator to the phase interpolator code, wherein the second non-linearity profile is offset in phase from the first non-linearity profile by the interpolation code offset, wherein the interpolation code offset is set such that the first non-linearity profile and second non-linearity profile are out-phased.

15. A system comprising:
a sampler configured to convert an input signal to a digital output signal;
a receiver phase-locked loop circuit configured to provide one or more input clock signals;
a phase interpolation circuit coupled to the receiver phase-locked loop circuit and the sampler, wherein the phase interpolation circuit is configured to provide a combined recovered clock signal to the sampler, wherein the phase interpolation circuit further comprises:
a first phase interpolator configured to generate a first recovered clock signal based on the one or more input clock signals and a first code; and
a second phase interpolator configured generate a second recovered clock signal based on the one or more input clock signals and a second code, wherein the second code has an interpolation code offset from the first code, wherein the interpolation code offset corresponds to a phase shift in the second recovered clock signal relative to the first recovered clock signal;
wherein the outputs of the first phase interpolator and second phase interpolator are configured to be merged, wherein when combined, the first and second recovered clock signals form a combined recovered clock signal.

16. The system of claim 15, wherein the phase interpolation circuit further comprises an input phase control circuit, the input phase control circuit configured to adjust the one or more input clock signals, wherein adjusting the one or more input clock signals includes adjusting at least one of a phase or amplitude of at least one of the one or more input clock signals based on a multi-phase error of the at least one of the one or more input clock signals.

17. The system of claim 15, wherein at least one of the first and second phase interpolators further comprises a plurality of digital-to-analog converters (DACs), wherein the plurality of DACs are segmented into groups of DAC units, wherein each DAC unit in a respective group of DAC units is controlled by a respective at least one of the first code or the second code, the at least one of the first and second phase interpolators are configured to generate the at least one of the first recovered clock or second recovered clock based on a combined output of each DAC unit in a respective group of DAC units.

18. The system of claim 15, wherein the phase interpolation circuit further comprises one or more clipping buffers configured to clip a voltage of a respective output of at least one of the first phase interpolator and second phase interpolator.

19. The system of claim 15, wherein the interpolation code offset corresponding to the phase shift in the second recovered clock signal is a 45-degree code offset corresponding to a 45-degree phase shift in the second recovered clock signal relative to the first recovered clock signal.

20. The system of claim 15, wherein the first phase interpolator has a first non-linearity profile relating integral non-linearity (INL) of the first phase interpolator to a phase interpolator code, and wherein the second phase interpolator has a second non-linearity profile relating INL of the second phase interpolator to the phase interpolator code, wherein the second non-linearity profile is offset in phase from the first non-linearity profile by the interpolation code offset, wherein the interpolation code offset is set such that the first non-linearity profile and second non-linearity profile are out-phased.

* * * * *